(12) United States Patent
O'Connell

(10) Patent No.: US 9,368,191 B2
(45) Date of Patent: Jun. 14, 2016

(54) TIME DIVISION MULTIPLEXING SENSE AMPLIFIER

(75) Inventor: Cormac Michael O'Connell, Kanata (CA)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 17 days.

(21) Appl. No.: 13/183,154

(22) Filed: Jul. 14, 2011

(65) Prior Publication Data

US 2013/0016576 A1 Jan. 17, 2013

(51) Int. Cl.
G11C 7/00 (2006.01)
G11C 11/4094 (2006.01)
G11C 11/4091 (2006.01)
G11C 11/4097 (2006.01)

(52) U.S. Cl.
CPC ........ G11C 11/4094 (2013.01); G11C 11/4091 (2013.01); G11C 11/4097 (2013.01)

(58) Field of Classification Search
USPC ........................................................ 365/203
See application file for complete search history.

(56) References Cited

U.S. PATENT DOCUMENTS

| | | | | |
|---|---|---|---|---|
| 5,554,874 A * | 9/1996 | Doluca | ................... | G11C 7/18 257/390 |
| 5,991,223 A * | 11/1999 | Kozaru et al. | ........ | G11C 7/1018 365/230.03 |
| 7,590,017 B2 * | 9/2009 | Romanovskyy | ........ | G11C 5/147 365/149 |
| 8,305,788 B2 * | 11/2012 | Matsui | ...................... | G11C 7/12 365/149 |
| 2002/0181307 A1 * | 12/2002 | Fifield | .................... | G11C 7/062 365/208 |
| 2003/0173593 A1 * | 9/2003 | Miyatake | ................. | G11C 7/18 257/200 |
| 2003/0231527 A1 * | 12/2003 | Nakase | .................... | G11C 7/22 365/196 |
| 2004/0240246 A1 * | 12/2004 | Golz | .................... | G11C 7/1051 365/51 |
| 2007/0159901 A1 * | 7/2007 | Obara | ...................... | G11C 7/12 365/203 |
| 2007/0242543 A1 * | 10/2007 | Romanovskyy | ........ | G11C 5/147 365/208 |
| 2008/0094928 A1 * | 4/2008 | Yokoyama | ............... | G11C 7/06 365/205 |
| 2010/0214856 A1 * | 8/2010 | Shiah | ...................... | G11C 7/065 365/189.16 |
| 2012/0307545 A1 * | 12/2012 | McAdams | ........... | G11C 11/221 365/145 |

* cited by examiner

Primary Examiner — Hoai V Ho
Assistant Examiner — Pablo Huerta
(74) Attorney, Agent, or Firm — Hauptman Ham, LLP

(57) ABSTRACT

A circuit comprises a plurality of memory cells, a word line, a plurality of pairs of bit lines, a pre-charge and equalization device, a column select device, and a sense amplifier. The word line is configured to control the plurality of memory cells. Each pair of bit lines of the plurality of pairs of bit lines corresponds to a memory cell of the plurality of memory cells and is coupled to a pair of switches. The sense amplifier is coupled to the plurality of pairs of bit lines, the pre-charge and equalization device, and the column select device.

20 Claims, 5 Drawing Sheets

TIME DIVISION MULTIPLEXING SENSE AMPLIFIER

FIELD

The present disclosure is related to time division multiplexing into a sense amplifier.

BACKGROUND

Destructive reads are generally used in dynamic random access memory (DRAM). For example, when a word line is activated for a row of memory cells to be read, a destructive read occurs. The read data needs to be restored or written back to the memory cells. Otherwise, the data in the memory cells is invalid. In some approaches, sense amplifiers are used to amplify the data and restore the data to the memory cells.

In submicron manufacturing processes, such as 90 nanometer (nm) technology nodes or below, the die area of the sense amplifiers, and of some other circuitry, does not shrink at the same rate as the rest of the memory, even though the technology nodes have scaled down. As a result, compared with other areas of the memory, the sense amplifiers occupy a relatively high die space percentage wise. In some approaches, the sense amplifiers typically occupy about 20% of the total die area of an embedded DRAM (eDRAM) macro. There is a need to reduce the sense amplifier die area.

BRIEF DESCRIPTION OF THE DRAWINGS

The details of one or more embodiments of the disclosure are set forth in the accompanying drawings and the description below. Other features and advantages will be apparent from the description, drawings, and claims.

Like reference symbols in the various drawings indicate like elements.

DETAILED DESCRIPTION

Figure 1:
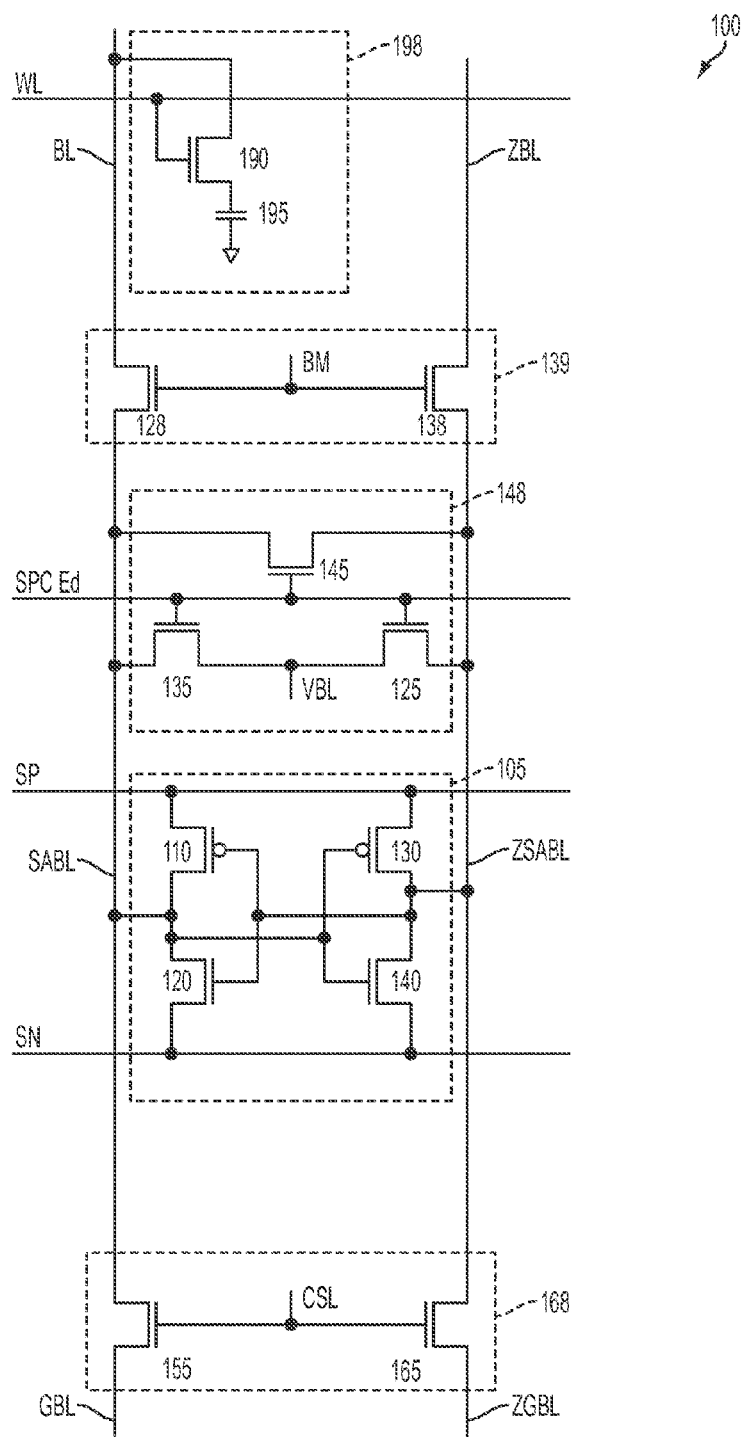
FIG. 1 is a diagram of a circuit illustrating an operation of a DRAM memory cell, bit lines, sense amplifier, pre-charge and equalization devices in accordance with some embodiments.

Embodiments, or examples, illustrated in the drawings are disclosed below using specific language. It will nevertheless be understood that the embodiments and examples are not intended to be limiting. Any alterations and modifications in the disclosed embodiments, and any further applications of the principles disclosed in this document are contemplated as would normally occur to one of ordinary skill in the pertinent art. Reference numbers may be repeated throughout the embodiments, but they do not require that feature(s) of one embodiment apply to another embodiment, even if they share the same reference number.

Some embodiments have one or a combination of the following features and/or advantages. Multiple bit lines are time multiplexed into one sense amplifier. As a result, the number of sense amplifiers used in a memory macro is reduced. In some embodiments, the sense amplifier die area is reduced by about 50%. Consequently, the proportion of the total die area containing bit cells in the DRAM macro with respect to the peripheral circuits, specifically the sense amplifiers, is increased.

Exemplary Circuits

FIG. 1 is a diagram of a circuit 100 illustrating an operation of a memory cell 195 in conjunction with a sense amplifier 105 and other circuitry, in accordance with some embodiments. Operational voltage VDD, ground reference voltage VSS, voltage VPP, and voltage VBB used in circuit 100 are not labeled. In some embodiments, unless otherwise specified, the high and low voltage levels of various signals are operational voltage VDD and ground reference voltage VSS, respectively. Voltage VPP is at least voltage VDD or higher. Voltage VBB is at least ground or lower. In some embodiments, voltages VDD, VSS, VPP, and VBB are 1V, 0V, 1.5V, and −0.4V, respectively. Voltage VBL is about ½ VDD.

Word line WL is used to turn on or off memory pass gate transistor 190 to allow access to memory cell 195 through transistor 190. In the example of FIG. 1, bit cell 198 having transistor 190 and memory cell 195 is electrically coupled to bit line BL for illustration. Depending on implementations in a memory array, some bit cells 198 are connected to bit line BL while some other bit cells 198 are connected to bit line ZBL. In some embodiments, a word line WL is coupled to a plurality of bit cells 198 that is coupled to either a bit line BL or a bit line ZBL. In the example of FIG. 1, word line WL is coupled to a plurality of bit cells 198 that is coupled to the corresponding plurality of bit lines BL. When word line WL at the gate of transistor 190 is applied with a Low, transistor 190 is turned off. The corresponding memory cell 195 is therefore electrically disconnected from bit line BL or from sense amplifier 105. When word line WL is applied with a High, however, transistor 190 is turned on. The corresponding memory cell 195 is electrically connected to bit line BL. In some embodiments, the high and low voltage levels for word line WL are voltage VPP and voltage VBB, respectively. NMOS transistor 190 used as a pass gate is for illustration. Other types of transistors, such as PMOS transistors, used as pass gates are within the scope of various embodiments.

In some embodiments, there is a plurality of word lines WL in a memory macro. The plurality of memory cells 195 associated with a word line WL are commonly referred to as a row of memory cells. As a result, there is a plurality of memory rows in a memory macro, and each row of memory cells is electrically coupled to a word line WL.

Bit cell 198 includes pass gate or transistor 190 and memory cell 195. Transistor 190 allows access between sense amplifier 105 and memory cell 195 through one of the bit lines BL or ZBL. In some embodiments, bit lines BL and ZBL are connected to an equal number of bit cells 198, but only one bit cell 198 is shown for illustration.

In some embodiments, memory cell 195 is a capacitor storing charge. When memory cell 195 is electrically connected to a bit line BL as shown in FIG. 1, bit line BL is pulled one way or another, depending on the charge indicating the logic value of memory cell 195. For example, if memory cell 195 stores a Low, bit line BL is pulled towards ground. Conversely, if memory cell 195 stores a High, bit line BL is pulled towards voltage VDD. As a result, a voltage difference between bit line BL and bit line ZBL starts to develop. The voltage difference between bit line BL and bit line ZBL is commonly called a bit line split.

Bit lines BL and ZBL serve as both data input and output (TO) for memory cell 195. Generally, except when being pre-charged and equalized, bit lines BL and ZBL are of the opposite logic values of one another. In a write cycle, applying a logic value to a first bit line enables writing the logic level at the first bit line to memory cell 195.

In a read cycle, sensing or reading the logic values at bit lines BL and ZBL reveals the data stored in memory cell 195. For example, once the bit line split is sufficiently large, sense amplifier 105 amplifies the bit line split, providing a full swing signal on bit lines BL and ZBL that represents the data to be read from memory cell 195. For example, if memory cell 195 stores a High, then sensing bit line BL reveals a High. Conversely, if memory cell 195 stores a Low then sensing bit line BL reveals a Low.

Multiplexing select device 139 includes a pair of transistors 128 and 138. The pair of transistors 128 and 138 is used to electrically connect/disconnect sense amplifier 105, pre-charge and equalization device 148 (PC/EQ device 148), and column select device 168, from the pair of bit lines BL and ZBL or from bit cell 198. For example, when signal BM is deactivated (applied with a Low), transistors 128 and 138 are turned off, the pair of bit lines BL and ZBL is electrically disconnected from the pair of sense amplifier bit lines SABL and ZSABL. As a result, sense amplifier 105, PC/EQ device 148, and device 168 are electrically disconnected from bit cell 198. In contrast, when signal BM is activated (applied with a High), transistors 128 and 138 are turned on, electrically connecting the pair of bit lines BL and ZBL to the pair of bit lines SABL and ZSABL. As a result, sense amplifier 105, PC/EQ device 148, and device 168 are electrically connected to bit lines BL and ZBL and bit cell 198. Multiplexing details in accordance with various embodiments are explained with references to FIGS. 2 and 3 below.

Pre-charge and equalization device (PC/EQ device) 148 includes transistors 125, 135, and 145. Signal SPCEQ and transistors 125, 135, and 145 are used to pre-charge and equalize bit lines BL and ZBL when bit lines BL and ZBL are electrically connected to bit lines SABL and ZSABL through transistors 128 and 138. The voltage value of signal SPCEQ is called voltage VSPCEQ (not labeled). In some embodiments, the drain and the source of each transistor 125, 135, and 145 are used interchangeably. Transistor 145 is coupled between bit lines BL and ZBL. Transistors 125 and 135 are coupled in series between bit lines (BL, ZBL) and VBL. When signal SPCEQ is applied with a High, transistors 125, 135, and 145 are turned on, enabling bit lines BL and ZBL to be at the same voltage level VBL at the drains of transistors 125 and 135. Stated differently, bit lines BL and ZBL are pre-charged and equalized to voltage VBL.

Sense amplifier 105 includes transistors 110, 120, 130, and 140. The pair of PMOS transistors 110 and 130, and the pair of NMOS transistors 120 and 140 form the sensing pairs for sense amplifier 105. When a bit line split of bit lines BL and ZBL that are electrically coupled to bit lines SABL and ZSABL is sufficiently developed, sense amplifier 105 is turned on to sense or amplify the bit line split and generate a full swing signal on local bit lines BL and ZBL that represent the data read from memory cell 195. Sense amplifier 105 also restores the data to memory cell 195, and sends the data to the corresponding global bit lines GBL and ZGBL, once pass gates 155 and 165 are turned on with signal CSL going High.

Signals SP and SN are used to turn on or off sense amplifier 105. Signal SP is commonly called the positive supply voltage while signal SN is commonly called the negative supply voltage, even though signal SN has a positive voltage in many situations. In general, when signals SP and SN are at a same level, amplifier 105 is off. But when signal SP is at operational voltage VDD and signal SN is at ground level or voltage VSS, sense amplifier 105 is on.

Local to global data path column select device 168 (column select device 168) includes global bit line pass gates, or transistors 155 and 165. Column select signal CSL and transistors 155 and 165 enable the data transfer between the pair of local bit lines BL and ZBL and the pair of global bit lines GBL and ZGBL through the pair of sense amplifier bit lines SABL and ZSABL, respectively. For example, when signal CSL is applied with a high logic value (High), transistors 155 and 165 are turned on. During a read cycle, the data on local bit lines BL and ZBL that have been transferred to sense amplifier bit lines SABL and ZSABL are transferred to global bit lines GBL and ZGBL, respectively. But when signal CSL is applied with a low logic value (Low), transistors 155 and 165 are turned off. Bit lines SABL and ZSABL and/or bit lines BL and ZBL are electrically disconnected from global bit lines GBL and ZGBL.

Exemplary Time Division Multiplexing

In some embodiments, to save the die space, a plurality of pairs of bit lines BL and ZBL is time multiplexed into a sense amplifier 105 through the pair of sense amplifier bit lines SABL and ZSABL. In other words, a sense amplifier 105 is shared among the plurality of pairs of bit lines BL and ZBL. To that end, various circuitries are also shared among the plurality of pairs of bit lines BL and ZBL.

Figure 2:
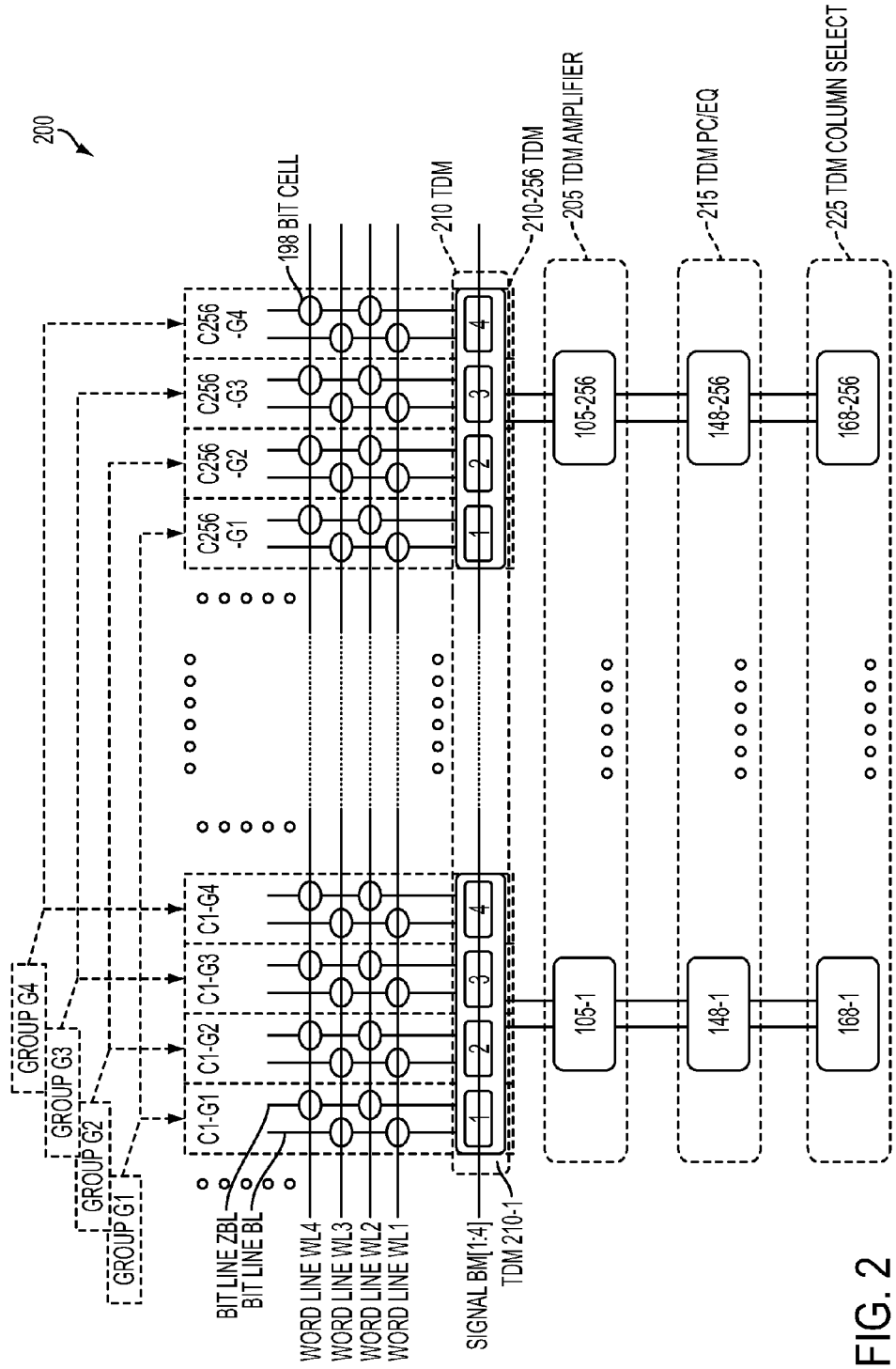
FIG. 2 is a diagram of a circuit illustrating time division multiplexing, in accordance with some embodiments.

FIG. 2 is a block diagram of a circuit 200, illustrating how sense amplifiers 105 are time multiplexed, in accordance with some embodiments.

For illustration, 1024 bit cells 198 corresponding to 1024 columns are coupled to a word line, and are divided into four groups G1, G2, G3, and G4. In FIG. 2, four word lines WL1, WL2, WL3, and WL4 are shown for illustration. A different number of word lines is within the scope of various embodiments. Various bit cells 198 coupled to a word line are shown, but, for simplicity, one bit cell 198 is labeled. Similarly, various pairs of bit lines BL and ZBL are shown, but one pair of bit lines BL and ZBL is labeled. Each group G1, G2, G3, and G4 has 256 columns corresponding to 256 columns of bit cells 198. Time division multiplexer (TDM) 210 includes 256 TDMs 210-1 to 210-256. TDM 210-1 corresponds to columns C1 of groups G1, G2, G3, and G4. TDM 210-2 corresponds to columns C2 of groups G1, G2, G3, and G4, and TDM 210-256 corresponds to columns C256 of groups G1, G2, G3, and G4, etc. TDM amplifier 205 includes 256 amplifiers 105-1 to 105-256. Sense amplifier 105-1 corresponds to columns C1 of groups G1, G2, G3, and G4. Sense amplifier 105-2 corresponds to columns C2 of groups G1, G2, G3, and G4, and sense amplifier 105-256 corresponds to columns C256 of groups G1, G2, G3, and G4, etc. In some embodiments, 256 memory cells 195 in 256 columns in each group G1, G2, G3, and G4 are processed in a read or a write operation simultaneously. When 256 columns C1 to C256 in each group G1, G2, G3, and G4 are processed simultaneously, 256 TDMs 210-1 to 210-256 and 256 amplifiers 105-1 to 105-256 operate simultaneously.

For illustration, TDM 210-1 of TDM 210 is time multiplexed by four bit cells 198, and each bit cell 198 is in column C1 in each group G1, G2, G3, and G4. In other words, four bit cells 198 in columns C1 in each group G1, G2, G3, and G4 are time multiplexed into one TDM 210-1, and are for use by sense amplifier 105-1. Similarly, four bit cells 198 in column C2 in each group G1, G2, G3, and G4 are multiplexed into TDM 201-2 for use by sense amplifier 105-2. Four bit cells 198 in column C256 in each group G1, G2, G3, and G4 are multiplexed into TDM 201-256 for use by sense amplifier 105-256, etc.

TDM pre-charge and equalization device 215 includes 256 pre-charge and equalization devices 148-1 to 148-256 that are used to pre-charge and equalize bit lines BL and ZBL that are electrically coupled to bit lines SABL and ZSABL.

TDM column select device 225 includes 256 column select device 168-1 to 168-256 that are used to transfer the data between global bit lines GBL and ZGBL and the data that are time multiplexed to amplifiers 105-1 to 105-256.

Bit line multiplexer signals BM are used to connect in turn each of the 256 pairs of bit lines BL and ZBL of groups G1, G2, G3, and G4 to the 256 amplifiers 105-1 to 105-256.

In FIG. 2, 1024 bit cells 198 are coupled to a word line, and are used for illustration. Four groups G1, G2, G3, and G4 are also used for illustration. Different numbers of bit cells 198 can be associated with a word line. Different numbers of groups of bit cells corresponding to a word line, and different numbers of bit cells 198 in a group G1, G2, G3, and G4 are within the scope of various embodiments.

Figure 3:
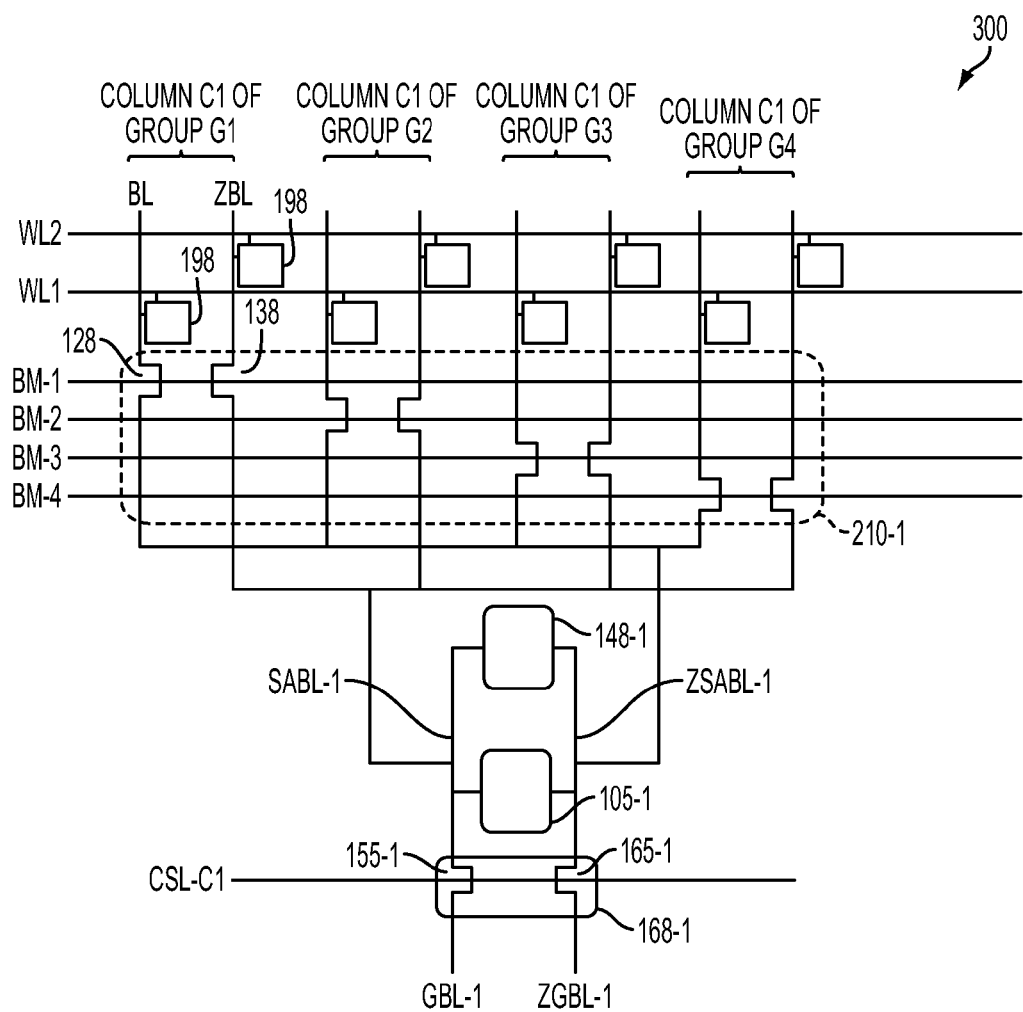
FIG. 3 is a diagram of a circuit illustrating the connections of a time division multiplexer, in accordance with some embodiments.

FIG. 3 is a diagram of a circuit 300 illustrating a connection of a TDM sense amplifier 105-1 with four pairs of bit lines BL and ZBL in column C1 of groups G1, G2, G3, and G4. The connection of each of TDM sense amplifiers 105-2 to 105-256 with corresponding pairs of bit lines BL and ZBL in other columns should be recognizable by persons of ordinary skill in the art after reviewing this document. For simplicity, elements in column C1 of group G1, G2, G3, and G4 are shown in FIG. 3, but elements in column C2 and higher of groups G1, G2, G3, and G4 are not shown. Further, bit cells 198 and transistors 128 and 138 in column C1 of group G1 are labeled, but bit cells 198 and transistors 128 and 138 in column C1 of groups G2, G3, and G4 are not labeled.

Word line WL1 is coupled to a plurality of bit cells 198 that are coupled to the corresponding bit lines BL. Word line WL2 is coupled to a plurality of bit cells 198 that are coupled to the corresponding bit lines ZBL.

The gates of transistors 128 and 138 are coupled together. Signals BM-1, BM-2, BM-3, and BM-4 at the gates of the corresponding transistors 128 and 138 are used to control the corresponding transistors 128 and 138 in the corresponding group G1, G2, G3, and G4, respectively. For example, when signal BM-1 is applied with a High, transistors 128 and 138 in group G1 are on. But when signal BM-1 is applied with a Low, transistors 128 and 138 in group G1 are off. Similarly, when signal BM-2 is applied with a High, transistors 128 and 138 in group G2 are on. But when signal BM-2 is applied with a Low, transistors 128 and 138 in group G2 are off, etc.

Multiplexer 210-1 includes pass gate transistors 128 and 138 that are used to electrically connect/disconnect sense amplifier 105-1, PC/EQ 148-1 and column select device 168-1, from the pair of bit lines BL and ZBL. For example, when the pair of transistors 128 and 138 in group G1 is on, the pair of sense amplifier bit lines SABL and ZSABL is electrically coupled to the pair of bit lines BL and ZBL in column C1 of group G1. When the pair of transistors 128 and 138 in group G2 is on, the pair of bit lines SABL and ZSABL is electrically coupled to the pair of bit lines BL and ZBL in column C1 of group G2. When the pair of transistors 128 and 138 in group G3 is on, the pair of bit lines SABL and ZSABL is electrically coupled to the pair of bit lines BL and ZBL in column C1 of group G3, etc. Effectively, the pair of bit lines BL and ZBL in each column C1 in each group G1, G2, G3, and G4 is multiplexed by multiplexer 210-1 into sense amplifier 105-1. For simplicity, when the pair of bit lines SABL and ZSABL is coupled to the pair of bit lines BL and ZBL, the pair of bit lines BL and ZBL and the pair of bit lines SABL and ZSABL are used interchangeably.

In some embodiments, so that the high voltage value of bit lines BL and ZBL and bit lines SABL and ZSABL is at voltage VDD, the high and low voltage levels for signals BM are selected to be voltage VPP and voltage VSS, respectively. The pairs of transistors 128 and 138 shown as NMOS transistors are used for illustration. In some other embodiments, transistors 128 and 138 are PMOS transistors. As a result, so that the low voltage value for bit lines BL and ZBL and bit lines SABL and ZSABL is at voltage VSS, the high and the low voltage levels for signals BM are voltage VDD and voltage VBB, respectively.

Pre-charge and equalization device 148-1 is used to pre-charge and equalize the pair of bit lines BL and ZBL in column C1 in each group G1, G2, G3, and G4 that have been electrically coupled to the pair of sense amplifier bit lines SABL and ZSABL. Effectively, the pair of bit lines BL and ZBL in column C1 in each group G1, G2, G3, and G4 shares pre-charge and equalization device 148-1. In some embodiments, so that the high voltage value of bit lines SABL and ZSABL and bit lines BL and ZBL is at voltage VDD, the high and the low voltage levels for signal SPCEQ at the gates of transistors 125, 135, and 145 (shown in FIG. 1) of PC/EQ device 148-1 are selected to be voltage VPP and voltage VSS, respectively. Transistors 125, 135, and 145, shown as NMOS transistors, are used for illustration. In some other embodiments, transistors 125, 135, and 145 are PMOS transistors. As a result, so that the low voltage value for bit lines SABL and ZSABL and bit lines BL and ZBL is at voltage VSS, the high and the low voltage levels for signal SPCEQ are voltage VDD and voltage VBB, respectively.

Column select device 168-1 includes transistors 155-1 and 165-1. Column select device 168-1 together with column select signal CSL-C1 are used to transfer the data on bit lines SABL-1 and ZSABL-1 to global bit lines GBL-1 and ZGBL-1, respectively.

In FIG. 3, sense amplifier 105-1 corresponds to PC/EQ device 148-1, column select device 168-1, and a pair of global bit lines GBL/ZGBL-1. In general, each sense amplifier 105 corresponds to a PE/EQ device 148, a column select device 168, and a pair of global bit lines GBL and ZGBL. For example, sense amplifier 105-2 corresponds to PC/EQ device 148-2 (not shown), column select 168-2 (not shown), and a pair of global bit lines GBL/ZGBL-2 (not shown). Sense amplifier 105-256 corresponds to PC/EQ device 148-256, column select device 168-256, and a pair of global bit lines GBL/ZGBL-256, etc.

Exemplary Methods of Operation

Figure 4:
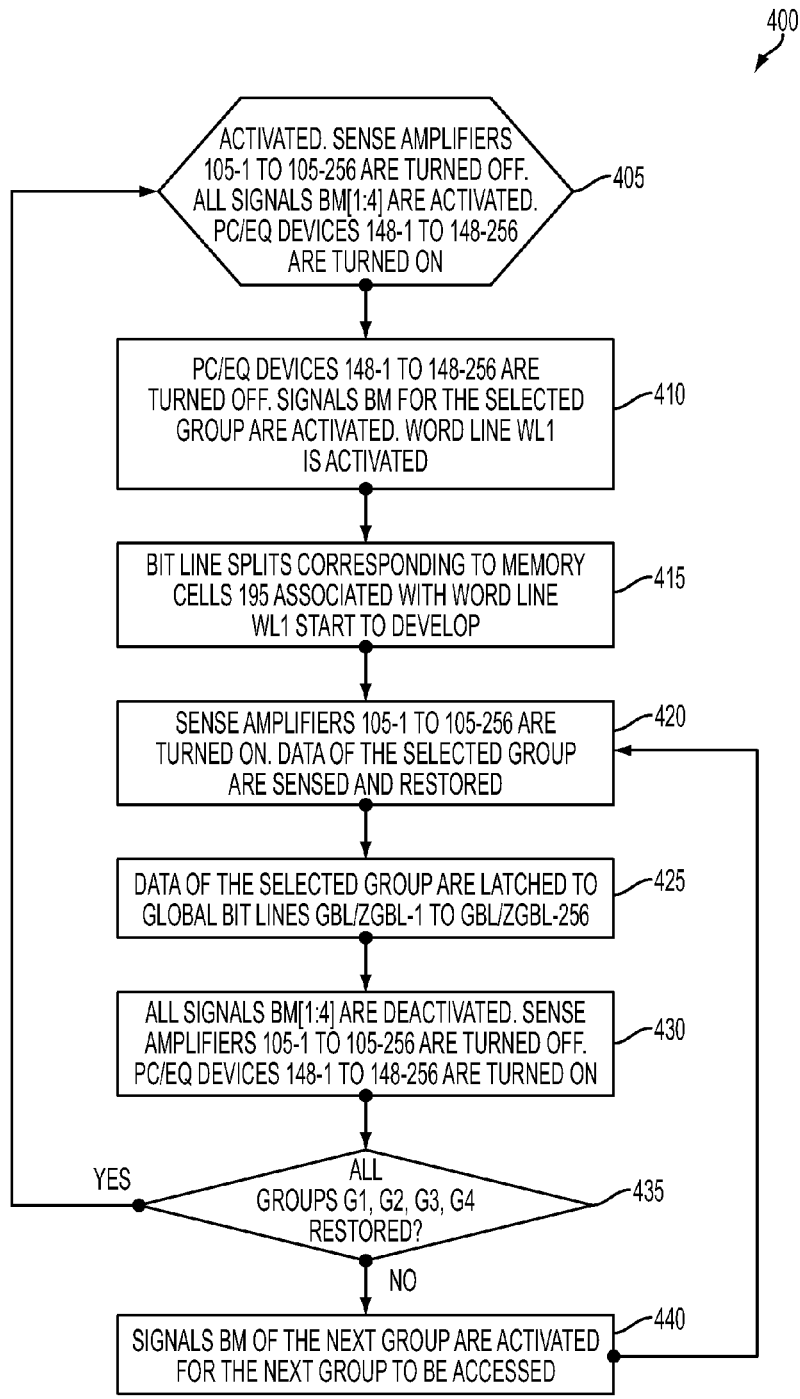
FIG. 4 is a flow chart of a method illustrating time multiplexing in a read operation of the circuit in FIG. 2, in accordance with some embodiments.

FIG. 4 is a flow chart of a method 400 illustrating time-multiplexing of circuit 200 in a read operation, in accordance with some embodiments.

In step 405, all word lines in circuit 200 are de-activated, and sense amplifiers 105-1 to 105-256 are turned off. All signals BM[1:4] corresponding to four groups G1, G2, G3, and G4 are activated. As a result, transistors 128 and 138 of 1024 columns of circuit 200 are turned on, and all 1024 pairs of bit lines BL and ZBL are electrically connected to 256 pairs of bit lines SABL/ZSABL-1 to SABL/ZSABL-256. Pre-charge and equalization devices 148-1 to 148-256 are then turned onto pre-charge and equalize 256 pairs of bit lines SABL/ZSABL-1 to SABL/ZSABL-256. Effectively, pre-charge and equalization devices 148-1 to 148-258 also pre-charge and equalize 1024 pairs of bit lines BL and ZBL In step 410, pre-charge and equalization devices 148-1 to 148-256 are turned off. All signals BM, except signal BM corresponding to the selected group G1, G2, G3, or G4, are de-activated. Effectively, the signals BM corresponding to the selected group are activated. As a result, transistors 128 and 138 of 256 columns of the selected group are turned on. Consequently, 256 pairs of bit lines BL/ZBL of the selected group are electrically coupled to 256 pairs of bit lines SABL/ZSABL-1 to SABL/ZSABL-256. Further, the word line corresponding to the memory cells 195 to be read is activated. For illustration, word line WL1 is activated. As a result, 1024 bit lines BL corresponding to word line WL1 are electrically coupled to 1024 corresponding memory cells 195.

In step 415, the bit line splits of 1024 pairs of bit lines BL and ZBL corresponding to word line WL1 start to develop.

In step 420, sense amplifiers 105-1 to 105-256 are turned on. Sense amplifiers 105-1 to 105-256 sense and amplify the data on 256 pairs of bit lines BL/ZBL of the selected group that are electrically coupled to bit lines SABL/ZSABL-1 to SABL/ZSABL-256. Sense amplifiers 105-1 to 105-256 also restore the amplified data of the selected group to the corresponding memory cells 195. In other words, sense amplifiers 105-1 to 105-256 sense, amplify, and restore the data in memory cells 195 of the selected group.

In step 425, the pairs of transistors 155 and 165 in column select devices 168-1 to 168-256 are turned on to electrically couple 256 pairs of bit lines SABL/ZSABL-1 to SABL/ZSABL-256 to 256 pairs of global bit lines GBL/ZGBL-1 to GBL/ZGBL-256. Effectively, the data of memory cells 195 of the selected group that are transferred to sense amplifier bit lines SABL and ZSABL are transferred to global bit lines GBL and ZGBL.

In step 430, all signals BM[1:4] corresponding to four groups G1, G2, G3, and G4 are deactivated. As a result, transistors 128 and 138 of 1024 columns of circuit 200 are turned off. Consequently, the pairs of bit lines SABL/ZSABL-1 to SABL/ZSABL-256 are electrically disconnected from all 1024 pairs of bit lines BL and ZBL of 1024 columns of circuit 200. Sense amplifiers 105-1 to 105-256 are also turned off, and pre-charge and equalization devices 148-1 to 148-256 are turned on.

In step 435, it is determined whether the data in all groups G1, G2, G3, and G4 have been restored. If the data in all groups G1, G2, G3, and G4 have been restored, the flowchart 400 returns to step 405.

If, however, the data in all groups G1, G2, G3, and G4 have not been restored, the signal BM for the next group is activated in step 435. As a result, transistors 128 and 138 of 256 columns of the next group are turned on. Consequently, 256 pairs of bit lines BL and ZBL of the next group are electrically coupled to 256 pairs of bit line SABL/ZSABL-1 to SABL/ZSABL-256. Flow chart 400 then returns to step 420 so that the next group is processed until all groups G1, G2, G3, and G4 are processed.

Figure 5:
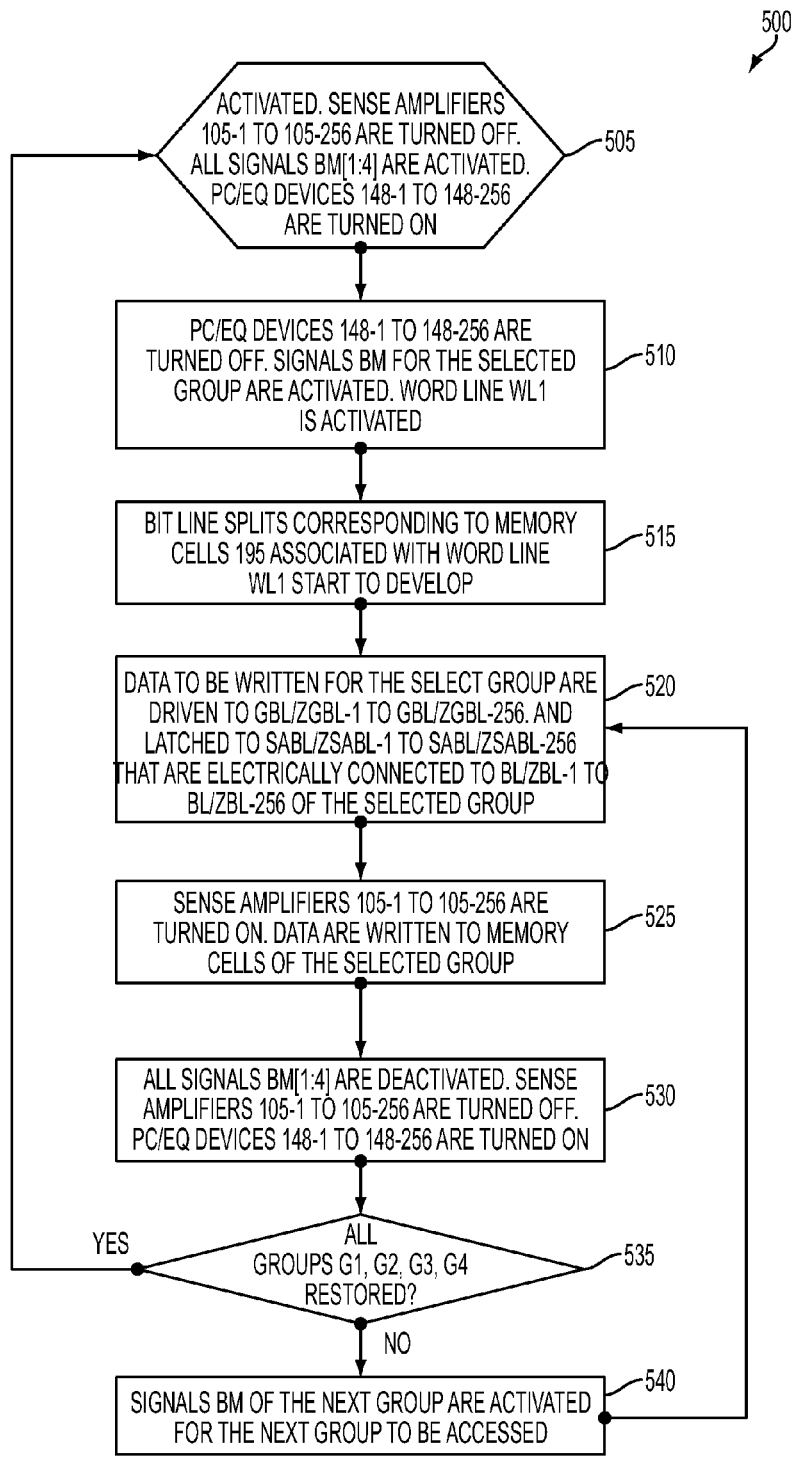
FIG. 5 is a flow chart of a method illustrating time multiplexing in a write operation of the circuit in FIG. 2, in accordance with some embodiments.

FIG. 5 is a flow chart of a method 500 illustrating time-multiplexing of circuit 200 in a write operation, in accordance with some embodiments.

In step 505, all word lines in circuit 200 are de-activated, and sense amplifiers 105-1 to 105-256 are turned off. All signals BM[1:4] corresponding to the four groups G1, G2, G3, and G4 are activated. As a result, transistors 128 and 138 of 1024 columns of circuit 200 are turned on, and all 1024 pairs of bit lines BL and ZBL are electrically connected to 256 pairs of bit lines SABL/ZSABL-1 to SABL/ZSABL-256. Pre-charge and equalization devices 148-1 to 148-256 are then turned onto pre-charge and equalize 256 pairs of bit lines SABL/ZSABL-1 to SABL/ZSABL-256. Effectively, pre-charge and equalization devices 148-1 to 148-256 also pre-charge and equalize all 1024 pairs of bit lines BL and ZBL In step 510, pre-charge and equalization devices 148-1 to 148-256 are turned off. All signals BM, except the signals BM corresponding to the selected group G1, G2, G3, or G4 are de-activated. Effectively, the signals BM corresponding to the selected group are activated. As a result, transistors 128 and 138 of 256 columns of the selected group are turned on. Consequently, 256 pairs of bit lines BL/ZBL of the selected group are electrically coupled to 256 pairs of bit lines SABL/ZSABL-1 to SABL/ZSABL-256. Further, the word line corresponding to the memory cells 195 to be written is activated. For illustration, word line WL1 is activated. As a result, 1024 bit lines BL corresponding to word line WL1 are electrically coupled to 1024 corresponding memory cells 195.

In step 515, the bit line splits of 1024 pairs of bit lines BL and ZBL corresponding to word line WL1 start to develop.

In step 520, the data to be written are driven to 256 pairs of global bit lines GBL/ZGBL-1 to GBL/ZGBL-256. The pairs of transistors 155 and 165 in column select devices 168-1 to 168-256 are turned on to electrically couple 256 pairs of bit lines SABL/ZSABL-1 to SABL/ZSABL-256 to 256 pairs of global bit lines GBL/ZGBL-1 to GBL/ZGBL-256.

In step 525, sense amplifiers 105-1 to 105-256 are turned on. Sense amplifiers 105-1 to 105-256 sense and amplify the data on 256 pairs of bit lines BL/ZBL of the selected group that are coupled to bit lines SABL/ZSABL-1 to SABL/ZSABL-256. Sense amplifiers 105-1 to 105-256 also write or restore the amplified data of the selected group to the corresponding memory cells 195. In other words, sense amplifiers 105-1 to 105-256 sense, amplify, and write data to memory cells 195 of the selected group.

In step 530, all signals BM[1:4] corresponding to four groups G1, G2, G3, and G4 are deactivated. As a result, transistors 128 and 138 of 1024 columns of circuit 200 are turned off. Consequently, 256 pairs of bit lines SABL/ZSABL-1 to SABL/ZSABL-256 are electrically disconnected from 1024 pairs of bit lines BL and ZBL of 1024 columns of circuit 200. Sense amplifiers 105-1 to 105-256 are turned off. Pre-charge and equalization devices 148-1 to 148-256 are turned on.

In step 535, it is determined whether the data in all groups G1, G2, G3, and G4 have been written. If the data in all groups G1, G2, G3, and G4 have been written, flowchart 500 returns to step 505.

If, however, the data in all groups G1, G2, G3, and G4 have not been written, the signal BM for the next group is activated in step 535. As a result, transistors 128 and 138 of 256 columns of the next group are turned on. Consequently, 256 pairs of bit lines BL and ZBL of the next group are electrically coupled to 256 pairs of bit lines SABL/ZSABL-1 to SABL/ZSABL-256. Flow chart 500 then returns to step 520 so that the next group is processed until all groups G1, G2, G3, and G4 are processed.

In the above illustration, 1024 bit cells 198 coupled to word line WL1 are for illustration. A different number of bit cells 198 being coupled to a word line is within the scope of various embodiments. Four columns and four memory cells being time multiplexed in to a sense amplifier are also for illustration. A different number of columns and memory cells being time multiplexed into a sense amplifier is within the scope of various embodiments.

Various embodiments are advantageous because a sense amplifier is shared by many memory cells and pair of bit lines. As a result, the number of sense amplifiers and, thus, the sense amplifier die area is reduced.

The illustration in this document is for a folded bit line (FBL) architecture. Open bit line (OPL) architectures are also applicable.

A number of embodiments have been described. It will nevertheless be understood that various modifications may be made without departing from the spirit and scope of the disclosure. For example, the various transistors being shown as a particular dopant type (e.g., N-type or P-type Metal Oxide Semiconductor (NMOS or PMOS)) are for illustration purposes. Embodiments of the disclosure are not limited to a particular type. Selecting different dopant types for a particular transistor is within the scope of various embodiments. The low or high logic level (e.g., Low or High) of the various signals used in the above description is also for illustration. Various embodiments are not limited to a particular level when a signal is activated and/or deactivated. Selecting different levels is within the scope of various embodiments. Various transistors function as switches. Replacing a transistor with a switch or a switching circuit is within the scope of various embodiments. The disclosed embodiments are explained in the context of a DRAM. Other types of memories are within the scope of the disclosure, including, for example, non-volatile random access memory (NVRAM), read only memory (ROM), one time programmable (OTP) memory, multiple-time programmable (MTP) memory, etc.

Some embodiments regard a circuit. The circuit comprises a plurality of memory cells, a word line, a plurality of pairs of bit lines, a pre-charge and equalization device, a column select device, and a sense amplifier. The word line is configured to control the plurality of memory cells. Each pair of bit lines of the plurality of pairs of bit lines corresponds to a memory cell of the plurality of memory cells and is coupled to a pair of switches. The sense amplifier is coupled to the plurality of pairs of bit lines, the pre-charge and equalization device, and the column select device.

Some embodiments regard a method. In the method, a plurality of pairs of data lines is configured such that a data split of each pair of data lines of the plurality of pairs of data lines develops. The plurality of pairs of data lines corresponds to a plurality of memory of cells that belong to a plurality of groups. Each data split of each pair of data lines of a plurality of first data lines that corresponds to a first group of first memory cells of the plurality of groups is amplified, thereby resulting in a first group of data corresponding to the first group of first memory cells. The first group of data is restored to the first group of first memory cells. Each data split of each pair of data lines of a plurality of second data lines corresponding to a second group of second memory cells of the plurality of groups is amplified, thereby resulting in a second group of data corresponding to the second group of second memory cells. Amplifying each data split of each pair of data lines of the plurality of second data lines is performed after amplifying each data split of each pair of data lines of the plurality of first data lines. The second data is restored to the second group of second memory cells.

Some embodiments regard a circuit comprising a word line, a plurality of bit cells, and a plurality of sense amplifiers. The plurality of bit cells is coupled to the word line, and belongs to a plurality of groups of group bit cells. A group of the plurality of groups of group bit cells corresponds to a plurality of pairs of bit lines. Each sense amplifier of the plurality of sense amplifiers is configured to selectively receive a pair of bit lines of each group of the plurality of groups of group bit cells, and is coupled to a pre-charge and equalization device and a pair of select devices.

The above methods show exemplary steps, but they are not necessarily performed in the order shown. Steps may be added, replaced, changed order, and/or eliminated as appropriate, in accordance with the spirit and scope of disclosed embodiments.

What is claimed is:

1. A circuit comprising:
   a first plurality of memory cells;
   a second plurality of memory cells;
   a word line configured to control the first and the second plurality of memory cells;
   a first plurality of pairs of bit lines, each pair of bit lines of the first plurality of pairs of bit lines corresponding to a memory cell of the first plurality of memory cells and coupled to a first plurality of pairs of switches, the first plurality of pairs of bit lines thereby corresponding to the first plurality of pairs of switches;
   a second plurality of pairs of bit lines, each pair of bit lines of the second plurality of pairs of bit lines corresponding to a memory cell of the second plurality of memory cells and coupled to a second plurality of pairs of switches, the second plurality of pairs of bit lines thereby corresponding to the second plurality of pairs of switches;
   a pre-charge and equalization device;
   a column select device;
   a first sense amplifier coupled to the first plurality of pairs of switches, the pre-charge and equalization device, and the column select device, the first sense amplifier being configured to access the first plurality of memory cells that are controlled by the word line;
   a second sense amplifier coupled to the second plurality of pairs of switches, the second sense amplifier being configured to access the second plurality of memory cells that are controlled by the word line; and
   a signal generator configured to generate a plurality of control signals, the first plurality of pairs of switches and the second plurality of pairs of switches being controlled by the plurality of control signals to cause
      the first plurality of pairs of bit lines to be time-division multiplexed into the first sense amplifier through the first plurality of pairs of switches, and
      the second plurality of pairs of bit lines to be time-division multiplexed into the second sense amplifier through the second plurality of pairs of switches,
      during a time period that the word line remains activated.

2. The circuit of claim 1, wherein the first plurality of pairs of bit lines corresponds to a first plurality of groups of memory cells, each pair of bit lines of the first plurality of pairs of bit lines belongs to a different group of the first plurality of groups of memory cells.

3. The circuit of claim 1, wherein the first sense amplifier is configured to selectively receive a selected pair of bit lines of the first plurality of pairs of bit lines through the corresponding first plurality of pairs of switches coupled to the selected pair of bit lines of the first plurality of pairs of bit lines, after the word line is activated.

4. The circuit of claim 3, wherein the pre-charge and equalization device is configured to pre-charge and equalize the first plurality of pairs of bit lines before the word line is activated.

5. The circuit of claim 1, wherein, when the first sense amplifier receives a pair of bit lines of the first plurality of pairs of bit lines:

the first sense amplifier is configured to amplify a bit line split of the received pair of bit lines, thereby resulting in first data;

the memory cell corresponding to the received pair of bit lines is configured to receive the first data; and the column select device is configured to transfer signals corresponding to signals on the received pair of bit lines to a pair of data lines.

6. The circuit of claim 1, wherein a pair of switches of the first plurality of pairs of switches is coupled to a pair of bit lines of the first plurality of pairs of bit lines includes a pair of transistors, gates of the pair of transistors coupled together and configured to receive at least a first voltage value higher than an operational voltage value and a second voltage value lower than a reference voltage value.

7. The circuit of claim 1, wherein a pair of switches of the first plurality of pairs of switches is coupled to a pair of bit lines of the first plurality of pairs of bit lines includes a pair of transistors, gates of the pair of transistors coupled together and configured to receive a voltage value used to control the pair of transistors.

8. The circuit of claim 1, wherein the pre-charge and equalization device is configured to receive at least a first voltage value higher than an operational voltage value and a second voltage value lower than a reference voltage value.

9. A method comprising:

configuring a plurality of pairs of data lines such that a data split of each pair of data lines of the plurality of pairs of data lines develops, the plurality of pairs of data lines corresponding to a plurality of memory cells that belong to a plurality of groups and that are controlled by a word line;

amplifying each data split of each pair of data lines of a plurality of first pairs of data lines corresponding to a first group of first memory cells of the plurality of groups of memory cells, thereby resulting in a first group of data corresponding to the first group of first memory cells;

restoring the first group of data to the first group of first memory cells;

amplifying each data split of each pair of data lines of a plurality of second pairs of data lines corresponding to a second group of second memory cells of the plurality of groups of memory cells, thereby resulting in a second group of data corresponding to the second group of second memory cells; and restoring the second group of data to the second group of second memory cells, wherein amplifying each data split of each pair of data lines of the plurality of second pairs of data lines is performed after amplifying each data split of each pair of data lines of the plurality of first pairs of data lines.

10. The method of claim 9, further comprising sending the first group of data to a first group of circuits before amplifying each data split of each pair of data lines of the plurality of second pairs of data lines.

11. The method of claim 9, wherein amplifying a first data split of a first pair of data lines of the plurality of the first pairs of data lines and amplifying a second data split of a second pair of data lines of the plurality of the second pairs of data lines are performed by a same amplifier that is time multiplexed to receive the first pair of data lines of the plurality of the first pairs of data lines and the second pair of data lines of the plurality of the second pairs of data lines.

12. The method of claim 9, wherein a first pair of data lines of the plurality of the first pairs of data lines and a second pair of data lines of the plurality of the second pairs of data lines share a same pre-charge and equalization device.

13. The method of claim 12, wherein the pre-charge and equalization device is configured to receive at least a first voltage value higher than an operational voltage value and a second voltage value lower than a reference voltage value.

14. The method of claim 9, wherein a pair of data lines of the plurality of the pairs of data lines is coupled to a pair of switches.

15. The method of claim 9, wherein a sense amplifier is coupled to a pair of switches corresponding to a pair of data lines of the plurality of pairs of data lines in each group of the plurality of groups.

16. The method of claim 15, wherein the pair of switches includes a pair of transistors configured to receive, at gates of the pair of transistors, at least a first voltage value higher than an operational voltage value and a second voltage value lower than a reference voltage value.

17. The method of claim 15, wherein the sense amplifier is further coupled to a pre-charge and equalization device and a second pair of switches.

18. A circuit comprising:

a word line;

a first plurality of bit cells and a second plurality of bit cells coupled to the word line;

a first plurality of bit lines corresponding to the first plurality of bit cells;

a second plurality of bit lines corresponding to the second plurality of bit cells;

a first time-division multiplexer;

a second time-division multiplexer;

a plurality of control signal lines electrically coupled with the first time-division multiplexer and the second time-division multiplexer; and a plurality of sense amplifiers, comprising:

a first sense amplifier configured to access the first plurality of bit cells that is controlled by the word line, the first time-division multiplexer being controlled by a plurality of control signals on the plurality of control signal lines to cause the first plurality of bit lines to be time-division multiplexed into the first sense amplifier through the first time-division multiplexer during a time period that the word line remains activated; and a second sense amplifier configured to access the second plurality of bit cells that is controlled by the word line, the second time-division multiplexer being controlled by the plurality of control signals on the plurality of control signal lines to cause the second plurality of bit lines to be time-division multiplexed into the second sense amplifier through the second time-division multiplexer during the time period that the word line remains activated.

19. The circuit of claim 18, wherein each sense amplifier of the plurality of sense amplifiers is coupled to a pre-charge and equalization device and a column select device.

20. The circuit of claim 18, wherein the first time-division multiplexer comprises a plurality of pairs of pass gate transistors, a pair of pass gate transistors of the plurality of pairs of pass gate transistors being coupled to a corresponding pair of bit lines of the first plurality of bit lines.

* * * * *